(12) United States Patent
Punzo

(10) Patent No.: US 10,024,944 B2
(45) Date of Patent: Jul. 17, 2018

(54) SHIMMING METHOD FOR CORRECTING INHOMOGEINITY OF A STATIC MAGNETIC FIELD GENERATED BY A MAGNET OF A NUCLEAR MAGNETIC RESONANCE MACHINE

(71) Applicant: Vincenzo Punzo, San Giorgio a Cremano (IT)

(72) Inventor: Vincenzo Punzo, San Giorgio a Cremano (IT)

(73) Assignee: ESAOTE S.P.A., Genoa (IT)

( * ) Notice: Subject to any disclaimer, the term of this patent is extended or adjusted under 35 U.S.C. 154(b) by 595 days.

(21) Appl. No.: 14/669,066

(22) Filed: Mar. 26, 2015

(65) Prior Publication Data
US 2015/0276911 A1    Oct. 1, 2015

(30) Foreign Application Priority Data
Mar. 28, 2014   (IT) ............................... GE2014A0032

(51) Int. Cl.
*G01R 33/565*    (2006.01)
*G01R 33/383*    (2006.01)
(Continued)

(52) U.S. Cl.
CPC ..... *G01R 33/56572* (2013.01); *G01R 33/383* (2013.01); *G01R 33/3873* (2013.01); *G01R 33/4822* (2013.01)

(58) Field of Classification Search
CPC ............ G01R 33/56563; G01R 33/565; G01R 33/3873; G01R 33/387; G01R 33/383; G01R 33/56572; G01R 33/4822
(Continued)

(56) References Cited

U.S. PATENT DOCUMENTS

| | | | | |
|---|---|---|---|---|
| 7,492,158 B2* | 2/2009 | Punzo | ................ | G01R 33/3802 324/319 |
| 2005/0024051 A1* | 2/2005 | Doddrell | .............. | A61B 5/7257 324/307 |

(Continued)

FOREIGN PATENT DOCUMENTS

EP          0940686 A1      9/1999

OTHER PUBLICATIONS

V. Punzo et al: "Solution of Laplace Equation on Non Axially Symmetrical Volumes," IEEE Transactions on Applied Superconductivity, vol. 16, No. 2, Jun. 1, 2006, pp. 1815-1818 The whole document.

(Continued)

*Primary Examiner* — Rishi Patel
(74) *Attorney, Agent, or Firm* — Themis Law

(57) ABSTRACT

A shimming method for correcting inhomogeneity of a static magnetic field generated by a magnet of a nuclear magnetic resonance imaging machine includes: measuring the magnetic field at a plurality of points over a reference surface; generating a polynomial that solves Laplace's equation with boundary conditions given on the reference surface, the polynomial representing the magnetic field on the reference surface and having a plurality of harmonic terms, each associated with a coefficient; determining the coefficients from the field sampling values; defining a grid for positioning a plurality of correction elements and relating it to the field structure; and calculating the position and magnitude parameters of the correction elements, such that the correction elements affect the coefficients of the magnetic field to obtain the desired field characteristics, wherein the reference surface is a superquadric surface, such that the magnetic field is corrected in a volume delimited by the superquadric surface.

9 Claims, 5 Drawing Sheets

(51) Int. Cl.
*G01R 33/3873* (2006.01)
*G01R 33/48* (2006.01)

(58) Field of Classification Search
USPC .................................. 324/300–322
See application file for complete search history.

(56) References Cited

U.S. PATENT DOCUMENTS

| | | | |
|---|---|---|---|
| 2007/0229077 A1 | 10/2007 | Punzo et al. | |
| 2008/0204018 A1 | 8/2008 | Dewdney et al. | |
| 2014/0028311 A1* | 1/2014 | Punzo ................ | G01R 33/3875 324/309 |

OTHER PUBLICATIONS

Stuart Crozier et al: "Ellipsoidal Harmonic (Lamé) MRI Shims," IEEE Transactions on Applied Superconductivity, vol. 12, No. 4, Dec. 1, 2002, pp. 1880-1885 The whole document.

\* cited by examiner

SHIMMING METHOD FOR CORRECTING INHOMOGEINITY OF A STATIC MAGNETIC FIELD GENERATED BY A MAGNET OF A NUCLEAR MAGNETIC RESONANCE MACHINE

FIELD OF THE INVENTION

The present invention relates to a shimming method for correcting inhomogeneity of a static magnetic field generated by a magnet of a nuclear magnetic resonance imaging machine, which includes the steps of: measuring the magnetic field at a plurality of points, over a reference surface; generating a polynomial that solves Laplace's equation with boundary conditions given on the reference surface, said polynomial representing the magnetic field on the reference surface and comprising a plurality of harmonic terms, each associated with a coefficient; determining the coefficients from the field sampling values; defining a grid for positioning a plurality of correction elements and relating it to the field structure; and calculating the position and magnitude parameters of said correction elements, such that the correction elements affect the coefficients of the magnetic field to obtain the desired field characteristics.

BACKGROUND OF THE INVENTION

Shimming methods are known in the art and allow the correction of magnetic field inhomogeneity in magnetic resonance imaging machines before imaging.

At the beginning, the magnetic field generated by the magnet is strongly affected by inhomogeneity caused by manufacturing tolerances and environmental interferences, which have highly detrimental effects on image quality.

The magnet is preferably a permanent magnet, although it can also be an electromagnet, namely, a superconducting electromagnet.

In the so called passive shimming, correction elements are placed on the surfaces of the pole pieces of the magnet to influence the magnetic field and bring it to an adequate homogeneity level for magnetic resonance imaging.

The grid for positioning correction elements as defined hereinbefore is intended to be formed on a ferromagnetic plate, commonly known as pole piece, which is placed orthogonal to the main field direction.

Therefore, the grid is placed on the magnet, the term magnet being generally intended not only as the macroscopic distribution for generating the main magnetic field, but also as any other ferromagnetic part that forms the system and hence also the pole piece.

The magnitude parameters of the correction elements as defined above include the geometric dimensions of the element and the magnetic properties of the material that forms the element.

In case of permanent magnets, the correction elements that are used for passive shimming are blocks of magnetized material.

Concerning the determination of position and magnitude parameters of one or more correction elements for obtaining the desired field characteristics, theoretical equations are provided in the art, which define the magnetic field generated in one point in space by a magnetic dipole located in one point of a positioning grid placed on a ferromagnetic pole piece having an infinite magnetic permeability.

Therefore, if a single correction element is defined, then all the expansions of the field generated at the points of the sampling grid may be calculated, by moving the single element from time to time over the positioning grid.

The expansions so created may be mathematically grouped into a so-called "effect matrix".

Using this effect matrix, appropriate mathematical minimization and/or optimization algorithms, such as pseudo-inversion, quadratic programming, Tikhonov regularization or else may allow determination of the best distribution of correction elements, in terms of their position on the positioning grid and magnitude parameters, to minimize or even eliminate field inhomogeneity.

The magnetic field shimming process is known to be mathematically based on the exact solution to Laplace's equation using the technique of separation of variables.

In short, the determination of an appropriate coordinate transformation from a Cartesian space to a "curvilinear" space allows determination of an exact solution to Laplace's equation, consisting of the product of three functions of one variable, which means that:

considering $F(\xi, \lambda, \varphi)$ as a solution to the Equation $\nabla^2 F(\xi, \lambda, \varphi)=0$ the following may be obtained:

$$F(\xi,\lambda,\varphi)=\Pi(\xi)*\Lambda(\lambda)*\Phi(\varphi)$$

As is further known, Laplace's equation is a differential equation and admits infinite solutions. One of them is chosen, which fulfills the boundary conditions defined on a surface D.

In this type of "boundary value problems," the selected surface D is usually (but not necessarily) a "coordinate" surface of the "curvilinear" space, i.e the geometric place in that defined "curvilinear" space where one of the three variables is constant. For example, in the case of spherical curvilinear coordinates $(r, \theta, \varphi)$, the coordinate surface under consideration is that with $r=R=$constant.

It should be noted that, for all "curvilinear" spaces in which the method of separation of variables can be used, the selected coordinate transformation causes one of the coordinate surfaces to be a sphere. In other words, and using an explanatory example, if we consider an ellipsoidal curvilinear space, the determined coordinate transformation (which allows separation of variables in the Laplace's equation) will cause an ellipsoid in the Cartesian space to become a spherical surface in the ellipsoidal space (which means that a "radius" of the ellipsoid may be determined).

There are possible cases of curvilinear spaces, in which such method may be used analytically, such that an exact solution to Laplace's equation may be obtained.

In this case, the associated surfaces are known as "quadrics" because the maximum degree of the equations that represent them is 2, and are closed surfaces or, in mathematical terms, are simply connected surfaces, e.g. a cube, a sphere, an oblate spheroid and an ellipsoid.

Finally, a linear superposition, i.e. a series of solution functions for Laplace's equation of this type will also be, due to the linearity of the Laplacian operator, a solution to Laplace's equation.

Bearing the above in mind, it shall be noted that in dedicated MRI, the image volume is usually defined as a cube or a parallelepiped within the cavity of the system and the hypothesis that the shimming volume contains the entire field of view (FOV), i.e. the image volume, is not always completely fulfilled.

For example, if the FOV is a cube with a side length of 140 mm, as is typical in magnetic resonance imaging machines, and the shimming surface is a quadric, and particularly an oblate spheroid with axes of 82×95 mm, the shimming volume only partially contains the image volume.

This involves the detrimental effect that shimming, i.e. homogeneity correction of the magnetic field, may be performed in areas outside the FOV, and that some areas of the latter will remain with a non-homogeneous magnetic field.

While this condition may be acceptable in certain cases, when allowed by the anatomy of the patient under examination, in other cases it leads to unacceptable artifacts, such as in sagittal T2-weighted Fast Spin Echo (FSE).

The attempt to contain the entire image volume with one of the quadrics inevitably leads to a considerable increase of the geometric dimensions of the apparatus.

This will necessarily increase the size, weight, amount of magnetic material, etc., thereby leading to a rapid increase of the costs of manufacture, installation, maintenance and operation of the magnetic resonance imaging machine.

One of the quadrics is the cube, and one may wonder why the most logical solution to entirely contain the FOV, a cubic shimming volume, is not chosen.

The answer to this is not found in mathematics, but in physics: the static shimming process requires a convergent solution series for Laplace's equation, i.e. with a finite limit of partial sums, and the problem must also be simplified by dividing it into independent or orthogonal subproblems or symmetries.

This possibility is prevented in the Cartesian-cubic case, if boundary conditions are other than zero.

This is clearly the case of MRI systems, in which boundary conditions are given on an obviously non-zero magnetic field B, both for field value conditions known as "Dirichlet" and for conditions on the value of the field derivative in a spatial direction, known as "Neumann".

Therefore, there currently exists a geometric problem preventing shimming volume-FOV overlap, which is yet unsolved by prior art shimming methods.

SUMMARY OF THE INVENTION

The present invention has the object of resolving this problem by providing a method as described hereinafter, in which, amongst else, the reference surface is a superquadric surface, such that the magnetic field is corrected in a volume delimited by the superquadric surface.

Therefore, the method is based on the construction of a solution to Laplace's equation that considers a superquadric, i.e. a surface described by an equation with a maximum degree greater than 2, instead of a quadric, as a boundary surface.

Superquadrics include surfaces that better contain the entire FOV and overlap the FOV to a maximized extent without requiring an increase of the size of the magnetic resonance imaging machine, and also afford simplification of the problem, i.e. division thereof into independent or orthogonal subproblems or symmetries.

In one exemplary embodiment, the superquadric surface is described by the following general equation expressed in spherical coordinates:

$$R(\vartheta, \varphi) = \frac{1}{\left[\left|\frac{\sin\frac{p\vartheta}{2}\cos\frac{q\varphi}{2}}{a}\right|^{\alpha} + \left|\frac{\sin\frac{p\vartheta}{2}\sin\frac{q\varphi}{2}}{c}\right|^{\gamma} + \left|\frac{\cos\frac{p\vartheta}{2}}{b}\right|^{\beta}\right]^{\upsilon}}. \quad (1)$$

where the parameters ($\alpha$, $\beta$, $\gamma$, $\upsilon$) are integers greater than 2.

Equation (1) describes the general superquadric surface, and may also encompass the non-symmetric case. Nevertheless, for the purposes of this method, only the symmetric case is considered, due to the symmetry of the FOV.

Equation (1) comprises nine parameters, which are all positive integers, and hence have infinite combinations. The parameters a, b, and c indicate spatial dimensions, whereas p and q represent spatial frequencies.

In a further exemplary embodiment, a coordinate transformation is made, such that the domain delimited by the superquadric surface is converted into an equivalent sphere having a unit radius, and Laplace's equation is solved by separation of variables and spherical harmonics.

In one embodiment, the coordinate transformation consists in:

$$x = \rho R(\vartheta,\varphi)\cos\varphi\sin\vartheta;\ y = \rho R(\vartheta,\varphi)\sin\varphi\sin\vartheta;\\ z = \rho R(\vartheta,\varphi)\cos\vartheta \quad (2).$$

A spherical coordinate transformation is thus introduced, in a version commonly known as stretched, where $R(\vartheta, \varphi)$ is defined in (1). It will be appreciated that this transformation will cause the domain D delimited by the boundary, i.e. the surface, $R(\vartheta, \varphi)$, to be transformed into a sphere with one radius in this new coordinate system. Replacement of (2) in the sphere equation:

$$x^2 + y^2 + z^2 = R(\vartheta,\varphi)^2$$

will provide the condition $\rho=1$

Since this transformation is valid, all classical methods known for the spherical case may be used for Laplace's equation in stretched spherical coordinates, and particularly the construction of a solution involving separation of variables and the use of the well-known spherical harmonics.

Therefore, considering the Laplacian operator in spherical coordinates:

$$\nabla^2 U = \frac{1}{r^2}\frac{\partial}{\partial r}\left(r^2\frac{\partial U}{\partial r}\right) + \frac{1}{r^2\sin\vartheta}\frac{\partial}{\partial\vartheta}\left(\sin\vartheta\frac{\partial U}{\partial\vartheta}\right) + \frac{1}{r^2\sin^2\vartheta}\frac{\partial^2}{\partial\varphi^2}U. \quad (3)$$

after appropriate mathematical steps we will obtain its version in stretched spherical coordinates:

$$\nabla^2 U = \frac{1}{R^2}\left[1 + \frac{R_\vartheta^2}{R^2} + \frac{R_\varphi^2}{R^2\sin^2\vartheta}\right]\frac{\partial^2}{\partial\rho^2}U + \quad (4)$$
$$\frac{1}{\rho R^2}\left[2\left(1 + \frac{R_\vartheta^2}{R^2} + \frac{R_\varphi^2}{R^2\sin^2\vartheta}\right) - \frac{1}{R}\left(R_\vartheta\cot\vartheta + R_{\vartheta\vartheta} + \frac{R_{\varphi\varphi}}{\sin^2\vartheta}\right)\right]\frac{\partial}{\partial\rho}U -$$
$$2\frac{R_\vartheta}{\rho R^3}\frac{\partial^2}{\partial\rho\partial\vartheta}U - 2\frac{R_\varphi}{\rho R^3\sin^2\vartheta}\frac{\partial^2}{\partial\rho\partial\varphi}U +$$
$$\frac{1}{\rho^2 R^2}\frac{\partial^2}{\partial\vartheta^2}U + \frac{\cot\vartheta}{\rho^2 R^2}\frac{\partial}{\partial\vartheta}U + \frac{1}{\rho^2 R^2\sin^2\vartheta}\frac{\partial^2}{\partial\varphi^2}U.$$

Through additional steps, not shown for brevity, a solution to Laplace's equation in stretched spherical coordinates by separation of variables may be constructed, i.e.

$$U(\rho,\vartheta,\varphi) = P(\rho)\Theta(\vartheta)\Phi(\varphi) \quad (5).$$

In one embodiment a field expansion is generated from the measured field values, which expansion is calculated on the equivalent sphere and comprises a plurality of harmonic terms, each associated with an additional coefficient.

In one embodiment, the expansion is:

$$f(\vartheta,\varphi) = \Sigma_{l=0}^{\infty}\Sigma_{m=0}^{l}P_l^m(\cos\vartheta)(\alpha_l^m\cos m\varphi + \beta_l^m\sin m\varphi) \quad (6).$$

where the additional coefficients are:

$$\begin{pmatrix} \alpha_l^m \\ \beta_l^m \end{pmatrix} = \varepsilon_m \frac{2l+1}{4\pi} \frac{(l+m)!}{(l-m)!} \int_0^{2\pi} \int_0^{\pi} f(\vartheta, \varphi) P_l^m(\cos\vartheta) \begin{pmatrix} \cos m\varphi \\ \sin m\varphi \end{pmatrix} \sin\vartheta \, d\vartheta \, d\varphi$$

with $$\varepsilon_m = \begin{cases} 1, & m = 0 \\ 2, & m \neq 0 \end{cases}$$

and $P_l^m(\cos\vartheta)$ being associated Legendre functions of the first kind In one exemplary embodiment, the coefficients of the polynomial are calculated from the additional coefficients.

According to an improvement, given the internal Dirichlet problem, $$\begin{cases} \nabla^2 U = 0 & r < R(\vartheta, \varphi) \\ U(r, \vartheta, \varphi) = f(\vartheta, \varphi) & r = R(\vartheta, \varphi) \end{cases}$$

the polynomial that solves the internal Dirichlet problem may be written, by separation of variables, as:

$$U(r,\vartheta,\varphi) = \Sigma_{l=0}^{\infty} \Sigma_{m=0}^{l} r^l P_l^m(\cos\vartheta)(A_l^m \cos m\varphi + B_l^m \sin m\varphi) \quad (7).$$

where the coefficients $A_l^m$ and $B_l^m$ are found by solving the infinite system of linear equations:

$$\sum_{l=0}^{\infty} \sum_{m=0}^{l} \begin{bmatrix} X_{l,m,h,k}^+ & Y_{l,m,h,k}^+ \\ X_{l,m,h,k}^- & Y_{l,m,h,k}^- \end{bmatrix} \cdot \begin{bmatrix} A_l^m \\ B_l^m \end{bmatrix} = \begin{bmatrix} \alpha_h^k \\ \beta_h^k \end{bmatrix} \quad (8)$$

$(h \in N_0, k = 0, 1, \ldots, h)$ and where the quantities $X_{l,m,h,k}^+$, $Y_{l,m,h,k}^+$, $X_{l,m,h,k}^-$, $Y_{l,m,h,k}^-$ are obtained using the following equations:

$$X_{l,m,h,k}^{\pm} = \varepsilon_k \frac{2h+1}{4\pi} \frac{(h-k)!}{(h+k)!} \quad (9)$$

$$\int_0^{2\pi} \int_0^{\pi} [R(\vartheta,\varphi)]^l P_l^m(\cos\vartheta) P_h^k(\cos\vartheta) \cos m\varphi \begin{pmatrix} \cos k\varphi \\ \sin k\varphi \end{pmatrix} \sin\vartheta \, d\vartheta \, d\varphi$$

$$Y_{l,m,h,k}^{\pm} = \varepsilon_k \frac{2h+1}{4\pi} \frac{(h-k)!}{(h+k)!}$$

$$\int_0^{2\pi} \int_0^{\pi} [R(\vartheta,\varphi)]^l P_l^m(\cos\vartheta) P_h^k(\cos\vartheta) \sin m\varphi \begin{pmatrix} \cos k\varphi \\ \sin k\varphi \end{pmatrix} \sin\vartheta \, d\vartheta \, d\varphi.$$

Equation (7) describes the polynomial that solves Laplace's equation representing the field on the reference surface.

It shall be noted that the condition (6) is actually, for our specific problem, a very strong condition because it requires the analytical knowledge of the function $f(\vartheta\varphi)$, which in this case is the magnetic field B.

The magnetic field is only experimentally known and the coefficients $\alpha_l^m$ and $\beta_l^m$ are only the projection of the field value of the superquadric on the equivalent sphere. Therefore, Equation (6) is an approximation (a zero order approximation) of the solution.

The accuracy of this approximation increases as the superquadric surface approaches a spherical surface, and a highly inaccurate approximation is obtained if the superquadric is very different.

Thus, an iterative, more correctly a perturbative correction, shall be implemented for the coefficients $\alpha_l^m$ and $\beta_l^m$.

In an exemplary embodiment, the coefficients are corrected using a perturbation-iteration algorithm which comprises the steps of:

calculating the additional coefficients by expansion from the measured field values;

calculating the coefficients of the polynomial from the additional coefficients;

calculating the maximum difference between the field represented by the polynomial and the measured field;

comparing the calculated maximum difference with a predetermined threshold value;

if the maximum calculated difference exceeds the threshold value, calculating the additional parameters based on the expansion calculated on the difference between the field represented by the polynomial and the measured field;

updating the additional parameters with the new calculated values;

iterating the process until obtaining a calculated maximum difference value that is smaller than the threshold value;

using the coefficients so obtained to calculate the position and magnitude parameters of the correction elements.

Therefore, the iterative process starts from the values $\alpha_l^m$ and $\beta_l^m$ calculated on the equivalent sphere and recursively corrects the coefficients $A_l^m$ e $B_l^m$ until it reaches an error maxError that is smaller than a preset numerical tolerance.

Since there is no analytical knowledge of the function $f$, the algorithm would not be applicable, because an error would result from the reconstruction of an excessively high field as measured from the obtained expansion, which means that the calculated expansion coefficients are not sufficiently correct. The iterative process reduces such error below an experimentally acceptable threshold, wherefore the solution to the Laplace's equation constructed with the stretched coordinates may be used for shimming.

Due to the generality of Equation (1), the superquadratic-based algorithm naturally also contains all the quadric-based algorithms that have already been implemented, such as the sphere, the oblate spheroid and the ellipsoid.

In one embodiment, a maximum degree of truncation of the polynomial is established, and the approval of such maximum degree for the shimming method is confirmed by convergence of the perturbation-iteration algorithm.

Therefore, the method allows recognition of whether a given magnetic field has spatial inhomogeneities associated with high expansion orders.

The non-convergence of the iteration indicates that the original field cannot be perfectly reconstructed with the selected maximum order $H_{max}$ and hence the field contains higher orders.

No other algorithm that is known heretofore to solve Laplace's equation can provide such information; the other algorithms can only assume that certain orders can be neglected from a given $H_{max}$ onwards. This assumption is not always valid and directly verifiable.

The shimming method of the present invention is universally valid, as shimming may be performed over any surface, by simply considering, from time to time, a different function R according to Equation (1). Therefore, it naturally covers: the sphere (by simply considering $a=b=c=R=R_0=$constant and $\alpha=\beta=\gamma=\nu=p=q=2$), the oblate spheroid and the ellipsoid.

The method may be used over an infinity of surfaces, namely $\infty^9$ surfaces.

The function basis of the method consists of spherical harmonics, which are well known both mathematically and in their physical meaning in MRI, due to their wide use in magnetostatics.

Finally, the method provides shimming surfaces that contain the entire selected FOV, and opens the way to a new design of "ultra-dedicated" apparatus.

BRIEF DESCRIPTION OF THE DRAWINGS

These and other features and advantages of the present invention will appear more clearly from the following description of a few embodiments, illustrated in the enclosed drawings, in which.

DETAILED DESCRIPTION OF EMBODIMENTS
OF THE INVENTION

Figure 1:
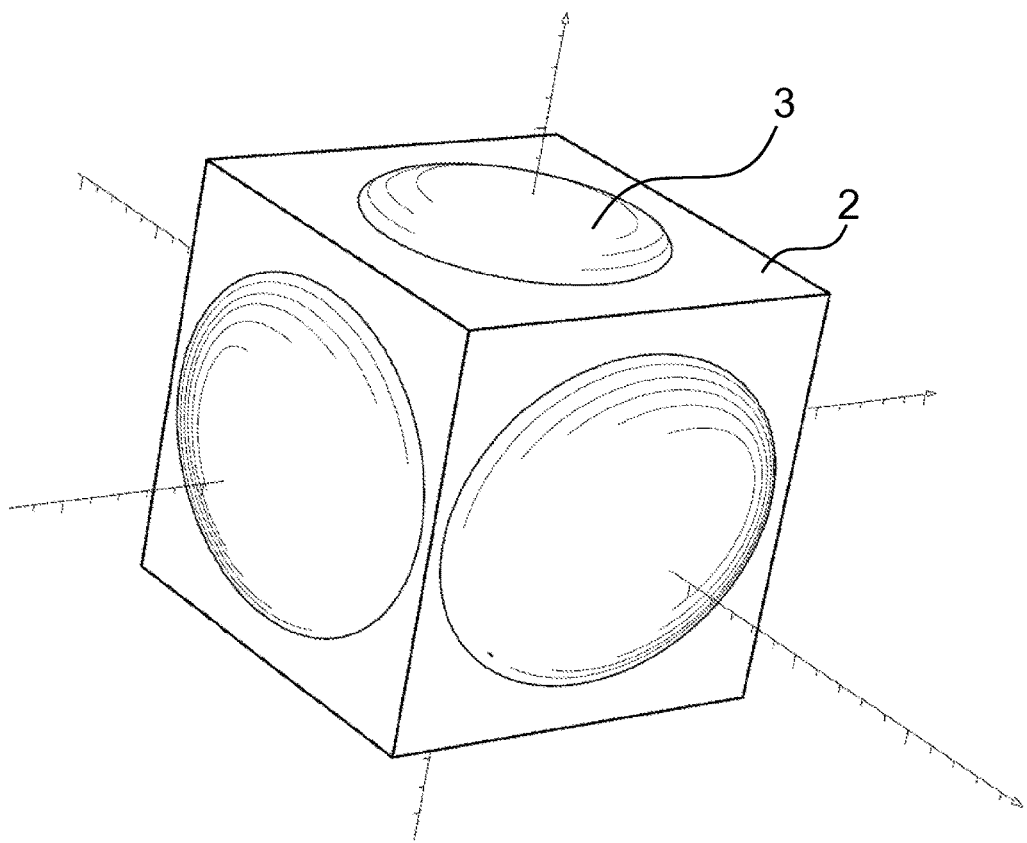
FIG. 1 shows the FOV and the quadric shimming surface according to the prior art.

FIG. 1 shows the shimming volume with a quadric surface 3 and the FOV 2 or image volume according to a prior art shimming method, particularly in a 0.31 T magnet.

The quadric surface 3 is an oblate spheroid with semiaxes of 82×95 mm along the axis Y and the axes X and Z respectively, whereas the FOV 2 is a cube with a side length of 140 mm.

In this configuration, some areas of the FOV 2 are apparently external to the shimming volume, namely near the vertices of the cube, and some areas concerned by the shimming process do not fall within the FOV 2, namely the central portions of the cube faces.

Figure 2:
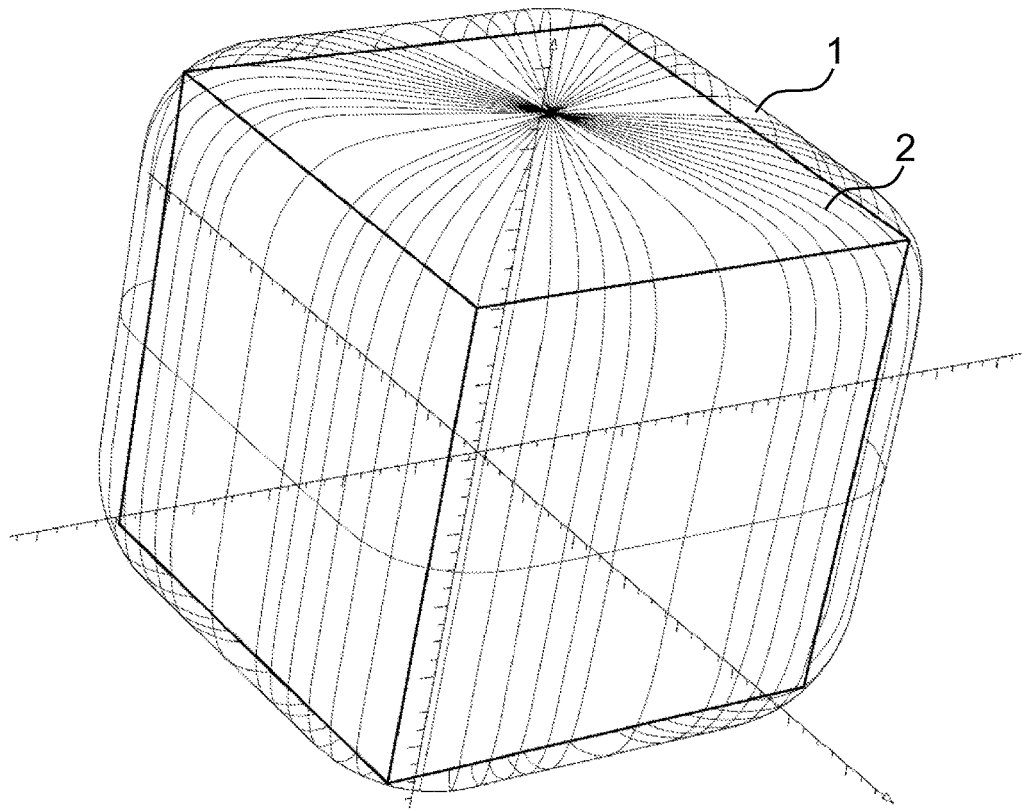
FIG. 2 shows the FOV and the superquadric shimming surface according to the present method.

FIG. 2 shows the FOV 2 and the superquadric shimming surface 1 of the present method, and particularly a superquadric 1 whose surface contains the entire FOV 2.

Considering the general Equation (1) the following values have been set for the parameters ($\alpha$, $\beta$, $\gamma$, $\nu$, a, b, c, p, q):

$$\alpha=6, \beta=6, \gamma=6, \nu=6,$$

$$a=85, b=82, c=85, p=2, q=2$$

The Equation obtained thereby is as follows:

$$R(\vartheta, \varphi) = \frac{1}{\left[\left|\frac{\sin\vartheta\cos\varphi}{85}\right|^6 + \left|\frac{\sin\vartheta\sin\varphi}{85}\right|^6 + \left|\frac{\cos\vartheta}{82}\right|^6\right]^{\frac{1}{6}}}. \quad (10)$$

This particular superquadric may be defined as a "superoblate spheroid of degree 6".

An optimal combination of the nine free parameters of Equation (1) was selected to contain the entire image FOV. Then, a maximum degree of six was selected, and the semiaxis in the XZ plane was set to 85 mm. The choice of a smaller degree would have led to an increase of such semiaxis; for example, given $\nu=4$, the surface curves earlier near the edges, and leaves them out of shimming control.

In order to provide a feasible shimming of the field, the initial inhomogeneity of the magnetic field had to be accounted for, said initial inhomogeneity being different, in terms of spatial symmetries of the field, from that on the oblate spheroid of FIG. 1.

Without going into detail, one may immediately understand that a reduction of the semiaxis in Z and X would reduce the contributions of the gradZ and gradX, and corresponding coefficient families, to field inhomogeneity, whereas the presence of four (rounded) edges leads to a greater contribution from the coefficients that depend on the angle $\varphi$ with terms such as $\sin 4\varphi$ and $\cos 4\varphi$, because $\varphi$ is the angle created in the XY plane by rotating about Y from X toward Z.

Further considerations are interesting, about customization of the above described general problem, when surfaces and magnets are symmetric in the three Cartesian directions.

Equation (8) indicates that, once a maximum degree $h=H_{max}$ has been experimentally and numerically determined, the coefficients $A_l^m$ and $B_l^m$ can be only obtained by solving a system of linear equations containing a square matrix M×M of coefficients $X_{l,m,h,k}^+$, $Y_{l,m,h,k}^+$, $X_{l,m,h,k}^-$, $Y_{l,m,h,k}^-$ where $M=[(H_{max}+1)(H_{max}+2)]$ to be inverted.

As one may easily understand, this operation may not always be feasible, due to the numerical tolerances involved, and this generally affects the stability of the method.

A possible simplification of the method, for a more robust matrix inversion comes from certain geometric and magnetic considerations, which apply to many magnets of currently known type.

Due to the orthogonality of spherical harmonics, the simultaneous symmetry of the superquadric surface and the magnet design, requires no mixing to occur between the coefficients $A_l^m$ and $B_l^m$ for spherical harmonics having different spatial symmetries, for example the symmetries of the coefficients eec (even-even-cos) and oec (odd-even-cos).

For this reason, the matrix M×M may be simplified by dividing it into 8 submatrices to be inverted and this operation is generally found to be more stable and robust, using an approach that is identical to traditional shimming.

The division of a single matrix into 8 submatrices (as many as the spatial symmetries of the magnetic field) is only valid if, as mentioned above, the superquadric surface and the magnet design are symmetrical in the three Cartesian directions.

Particular asymmetry conditions of the superquadric surface or the magnet surface (or both at the same time) inevitably leads to mixing of coefficients, e.g. a superquadric that is asymmetric in Y, which may be obtained by an appropriate selection of the 9 free parameters, and a totally symmetric magnet will cause mixing of coefficients belonging to eec and oec symmetries. Here, the matrix M×M can be partially divided into 7 submatrices (with a single submatrix for the eec-oec obviously having larger lines×column dimensions), and as a result the two symmetries will be mixed also during shimming: a distribution of correction dipoles with eec symmetry will also affect the oec symmetry, thereby requiring a single combined correction of both symmetries.

The symmetries are labeled herein to account for evenness or oddness of the indices l and m and the presence of the corresponding spherical harmonic of the cosine or sine of the angle $\varphi$.

Therefore, since a spherical harmonic is the product of a Legendre polynomial multiplied by the cosine (or sine) of $\varphi$, EEC is defined, for example, as the symmetry that corresponds to the Legendre polynomial with even l and even m, multiplied by cos(mφ).

Other possible spatial symmetries are defined likewise:

OEC=Legendre polynomial with odd l, even m, multiplied by cos(mφ)

OOC=Legendre polynomial with odd l, odd m, multiplied by cos(mφ)

OOS=Legendre polynomial with odd l, odd m, multiplied by sin(mφ)

EOC=Legendre polynomial with even l, odd m, multiplied by cos(mφ)

EOS=Legendre polynomial with even l, odd m, multiplied by sin(mφ)

EES=Legendre polynomial with even l, even m, multiplied by sin(mφ)

OES=Legendre polynomial with odd l, even m, multiplied by sin(mφ)

These eight spatial symmetries are the basis of orthogonal (and normalizable) functions that can be used to describe the field or any other function as a weighted superposition thereof, through the value of the corresponding coefficients $A_l^m$ and $B_l^m$.

Figure 3:
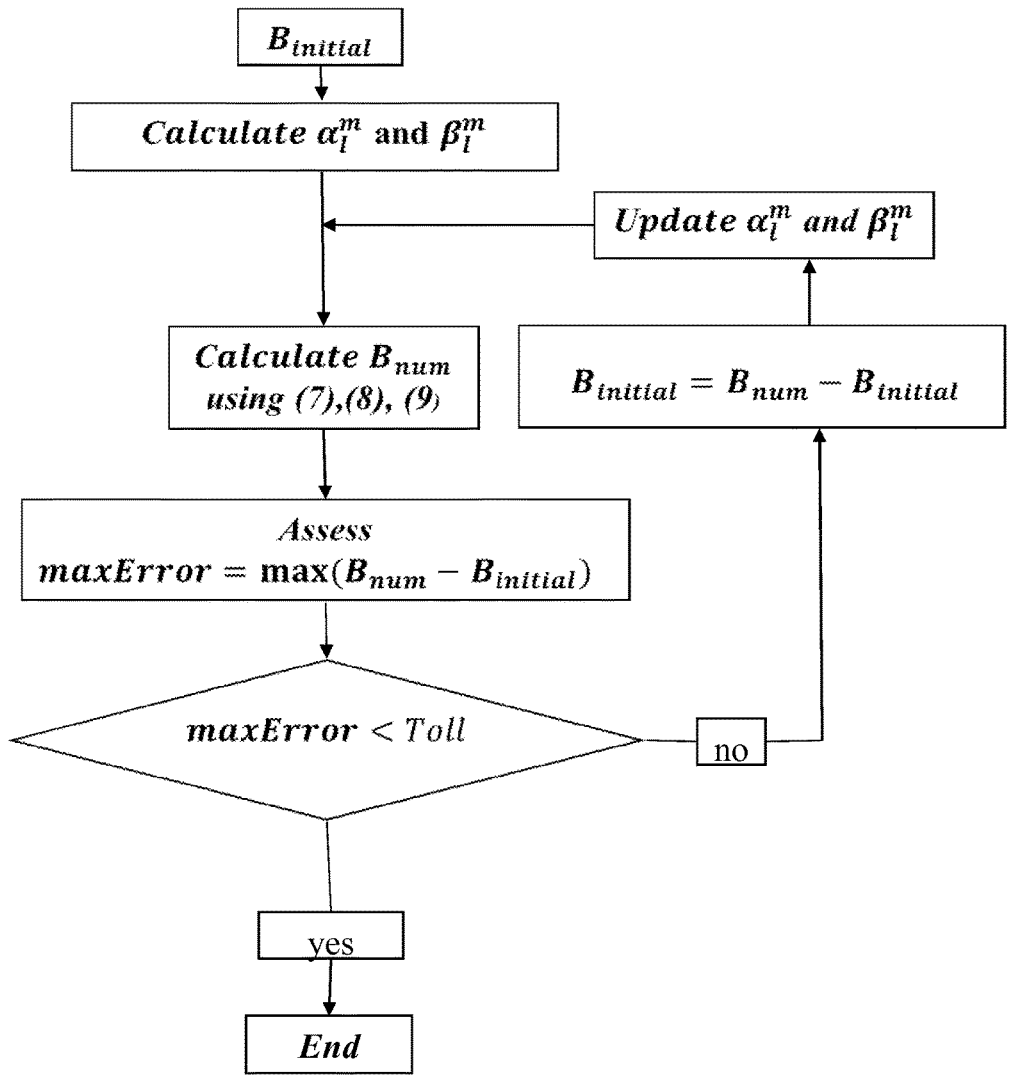
FIG. 3 shows a diagram of the iterative algorithm.

FIG. 3 shows the iterative coefficient correction process, which starts from the values $\alpha_l^m$ and $\beta_l^m$ calculated on the equivalent sphere and recursively corrects the coefficients $A_l^m$ and $B_l^m$ until it reaches an error maxError that is smaller than a preset numerical tolerance.

The algorithm as shown in the diagram starts from the knowledge of $B_{initial}$, i.e. the measured field, and calculates the additional coefficients $\alpha_l^m$ and $\beta_l^m$ through the Equation (6).

Then the field $B_{num}$, or numerical field, is calculated, using the Equations (7), (8) and (9).

Particularly, the matrix $X_{l,m,h,k}^\pm Y_{l,m,h,k}^\pm$ is formed using the Equation (9), the coefficients $A_l^m$ and $B_l^m$ will be calculated from the additional coefficients $\alpha_l^m$ and $\beta_l^m$ using the Equation (8), and the coefficients $A_l^m$ and $B_l^m$ so obtained will be inserted in the Equation (7) to determine the numerical field $B_{num}$.

The matrix $X_{l,m,h,k}^\pm Y_{l,m,h,k}^\pm$ may be calculated once throughout the iterative algorithm, as it is the projection of the superquadric on the sphere and remains unchanged.

Then, the maximum difference between the numerical field $B_{num}$ represented by the polynomial and the measured field $B_{initial}$ is calculated, as maxError=max ($B_{num}-B_{initial}$)

The calculated maximum difference maxError is compared with a predetermined tolerance threshold value Toll. If the calculated maximum difference exceeds the threshold value, and the condition maxError<Toll is not fulfilled, then the additional parameters $\alpha_l^m$ and $\beta_l^m$ are calculated based on the expansion calculated on the difference between the field represented by the polynomial and the measured field.

This is accomplished by calculating the difference between $B_{num}$ and $B_{initial}$ and the value so determined is considered the new $B_{initial}$, i.e. $B_{initial}=B_{num}-B_{initial}$.

Based on the new $B_{initial}$, new additional coefficients $\alpha_l^m$ and $\beta_l^m$ are found using the Equation (6), said additional coefficients $\alpha_l^m$ and $\beta_l^m$ update the previously determined additional coefficients $\alpha_l^m$ and $\beta_l^m$ and particularly are added to the previously determined additional coefficients.

Based on the updated additional coefficients $\alpha_l^m$ and $\beta_l^m$ the algorithm starts a new iteration, by calculating new coefficients, $A_l^m$ and $B_l^m$ and by recalculating the maximum difference maxError.

Therefore, at each iteration, the additional coefficients am and fir are updated based on the difference between $B_{num}$ and $B_{initial}$, which will progressively decrease, and the coefficients $A_l^m$ and $B_l^m$ are recalculated for the polynomial to approximate the measured field with a sufficient accuracy.

When the maximum difference maxError is smaller than the threshold Toll, the algorithm ends and the coefficients $A_l^m$ and $B_l^m$ that were found to calculate the position and amount parameters of the correction elements are used.

Figure 4:
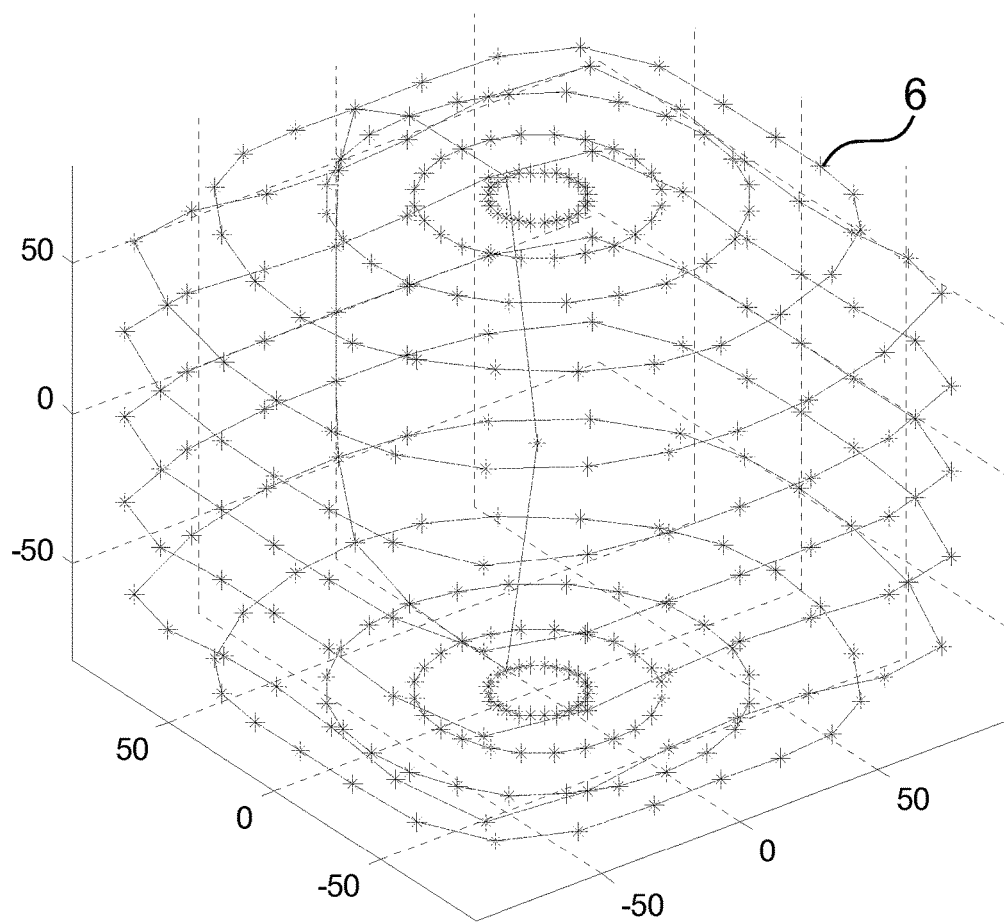
FIG. 4 shows a grid of sampling points.

As shown in FIG. 4, the magnetic field is measured on a grid 6 of sampling points.

The field value so calculated is the Dirichlet boundary condition for the Laplace's problem being considered. The sampling points, like in the other shimming algorithms, are defined by the Gauss abscissas that were determined for numerical assessment of the surface integrals defined in the Equations (9).

An analysis of the curve of the maximum deviation between the real field and the field recalculated according to (7) in three different field homogeneity situations, i.e. start of shimming, middle of shimming and end of shimming, and considering $H_{max}=12$ as the maximum order, the algorithm converges and returns an average point error of less than 5 ppm, which is compatible with the accuracy error of the other prior art shimming algorithms.

Full shimming of the magnetic field on the superoblate spheroid of degree 6 of FIG. 2 was simulated using appropriate modeling software.

Figure 5:
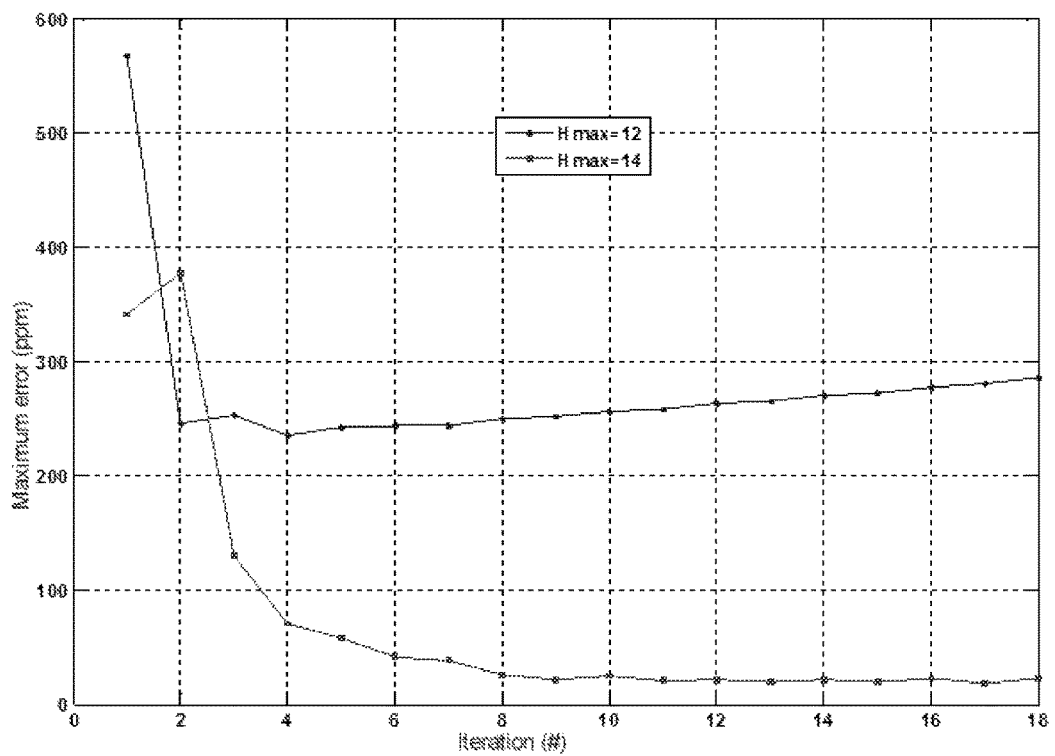
FIG. 5 shows the maximum difference curve during the iterative algorithm.

In this simulation, $H_{max}=12$ was initially supposed to be considered as the maximum order of the expansion but, as shown by the chart in FIG. 5, when the algorithm is truncated at such order, it returns a high maximum (and average) error, well beyond the requested accuracy threshold. Therefore, $H_{max}=14$ was used as a maximum order, which led to a well acceptable maximum error.

As compared with the above calculations, the modeling software accounts for all relevant magnetic behaviors, for the simulation to be as realistic as possible.

The difference from the above described calculations, in which with the maximum order $H_{max}=12$ the algorithm converges, may be explained by considering that the magnetic field $B_{initial}$ assessed in those cases resulted from a recalculation from field expansions that reached as far as an order 12, as is currently the case in prior art shimming methods having an oblate spheroid as a boundary surface, which means that no contributions of higher order, particularly of order 13 and 14, were supposed to be in the field.

In the quasi-real magnet that was considered in the shimming simulation, such high orders are present as post-confirmation that the same algorithm rapidly converges if these are accounted for in the field calculation.

The two lines in the chart of FIG. 5 show the curve of the maximum error (in ppm) as the number of iterations of the coefficient correction algorithm increases.

The line 4 corresponds to a truncation having 12 as a maximum order and diverges as the number of iterations increases, to show that the original field cannot be perfectly reconstructed with the selected maximum order 12 and hence the field contains higher orders.

The line 5 corresponds to a truncation having 14 as a maximum order and converges as the number of iterations increases, to show that the field can be reconstructed assuming 14 as a maximum order.

The reason for this difference may be also understood by realizing that the superquadric surface has a wider extension in Y than the corresponding quadric of FIG. 1, and contains farther areas of the magnet cavity, in which the field inhomogeneity has orders hither than $H_{max}=12$, considering that the highest inhomogeneity is found at the rounded edges in the superquadric 1 of FIG. 2.

The results of the simulation show that the shimming process has actually generated a more homogeneous field on the initially defined superquadric surface, and obviously inside it, because if a magnetic field is homogeneous over a closed surface it is also homogeneous within the volume defined by such surface.

While the invention has been described in connection with the above described embodiments, it is not intended to limit the scope of the invention to the particular forms set forth, but on the contrary, it is intended to cover such alternatives, modifications, and equivalents as may be included within the scope of the invention. Further, the scope of the present invention fully encompasses other embodiments that may become obvious to those skilled in the art and the scope of the present invention is limited only by the appended claims.

The invention claimed is:

1. A shimming method for correcting inhomogeneity of a static magnetic field generated by a magnet of a nuclear magnetic resonance imaging machine, the method comprising:
    measuring a magnetic field at a plurality of points over a reference surface;
    generating a polynomial that solves Laplace's equation with boundary conditions given on the reference surface, said polynomial representing the magnetic field on the reference surface and comprising a plurality of harmonic terms, each associated with a coefficient;
    determining coefficients from field sampling values;
    defining a grid for positioning a plurality of correction elements and relating the grid to field structure; and
    calculating position and magnitude parameters of said correction elements, such that the correction elements affect the coefficients of the magnetic field to obtain desired field characteristics;
    performing said shimming of the static magnetic field according to said step of calculating position and magnitude parameters of said correction elements;
    wherein the reference surface is a superquadric surface, such that the magnetic field is corrected in a volume delimited by the superquadric surface,
    wherein the superquadric surface is described by the following general equation expressed in spherical coordinates:

$$R(\vartheta, \varphi) = \frac{1}{\left[\left|\frac{\sin\frac{p\vartheta}{2}\cos\frac{q\varphi}{2}}{a}\right|^\alpha + \left|\frac{\sin\frac{p\vartheta}{2}\sin\frac{q\varphi}{2}}{c}\right|^\gamma + \left|\frac{\cos\frac{p\vartheta}{2}}{b}\right|^\beta\right]^\nu}$$

and wherein:
R is the superquadric surface having coordinates $\vartheta$, $\varphi$,
a, b, c are spatial dimensions,
p, q are spatial frequencies, and parameters ($\alpha$, $\beta$, $\gamma$, $\nu$) are integers greater than 2.

2. The shimming method as claimed in claim 1, wherein a coordinate transformation is made, such that a domain delimited by the superquadric surface is converted into an equivalent sphere having a unit radius, and Laplace's equation is solved by separation of variables and spherical harmonics.

3. The shimming method as claimed in claim 2, wherein the coordinate transformation is:

$$x=\rho R(\vartheta, \varphi)\cos\varphi\sin\vartheta;\ y=\rho R(\vartheta, \varphi)\sin\varphi\sin\vartheta;$$
$$z=\rho R(\vartheta, \varphi)\cos\vartheta$$

wherein:
x, y, z are Cartesian coordinates, and $\rho$ is an elliptical coordinate.

4. The shimming method as claimed in claim 2, wherein a field expansion is generated from the measured field sampling values, the field expansion being calculated on the equivalent sphere and comprising a plurality of harmonic terms, each associated with an additional coefficient.

5. The shimming method as claimed in claim 4, wherein the field expansion is:

$$f(\vartheta, \varphi) = \Sigma_{l=0}^{\infty}\Sigma_{m=0}^{l} P_l^m(\cos\vartheta)(\alpha_l^m \cos m\varphi + \beta_l^m \sin\varphi),$$

wherein the additional coefficients are $$\begin{pmatrix}\alpha_l^m \\ \beta_l^m\end{pmatrix} = \varepsilon_m \frac{2l+1}{4\pi}\frac{(l+m)!}{(l-m)!}\int_0^{2\pi}\int_0^\pi f(\vartheta,\varphi)P_l^m(\cos\vartheta)\begin{pmatrix}\cos m\varphi \\ \sin m\varphi\end{pmatrix}\sin\vartheta\, d\vartheta\, d\varphi$$

and wherein:
l, m are integers,
$\alpha_l^m$, $\beta_l^m$ are projection coefficients of the superquadric surface on an equivalent sphere, and
$P_l^m$ is a Legendre polinomial of the first kind.

6. The shimming method as claimed in claim 4, wherein the coefficients of the polynomial are calculated from the additional coefficients.

7. The shimming method as claimed in claim 6, wherein, given an internal Dirichlet problem, $$\begin{cases}\nabla^2 U = 0 & r < R(\vartheta, \varphi) \\ U(r, \vartheta, \varphi) = f(\vartheta, \varphi) & r = R(\vartheta, \varphi)\end{cases}$$

the polynomial are written, by separation of variables, as:

$$U(r, \vartheta, \varphi) = \sum_{l=0}^{\infty}\sum_{m=0}^{l} r^l P_l^m(\cos\vartheta)(A_l^m \cos m\varphi + B_l^m \sin m\varphi)$$

wherein the coefficients $A_l^m$ and $B_l^m$ are found by solving an infinite system of linear equations:

$$\sum_{l=0}^{\infty}\sum_{m=0}^{l}\begin{bmatrix}X_{l,m,h,k}^+ & Y_{l,m,h,k}^+ \\ X_{l,m,h,k}^- & Y_{l,m,h,k}^-\end{bmatrix}\cdot\begin{bmatrix}A_l^m \\ B_l^m\end{bmatrix} = \begin{bmatrix}\alpha_h^k \\ \beta_h^k\end{bmatrix}$$

$(h \in N_0, k = 0, 1, \ldots, h)$ wherein quantities $X_{l,m,h,k}^+$, $Y_{l,m,h,k}^+$, $X_{l,m,h,k}^-$, $Y_{l,m,h,k}^-$ are obtained with the following equations:

$$X_{l,m,h,k}^+ = \varepsilon_k \frac{2h+1}{4\pi}\frac{(h-k)!}{(h+k)!}$$

$$\int_0^{2\pi}\int_0^\pi [R(\vartheta,\varphi)]^l P_l^m(\cos\vartheta)P_h^k(\cos\vartheta)\cos m\varphi\begin{pmatrix}\cos k\varphi \\ \sin k\varphi\end{pmatrix}\sin\vartheta\, d\vartheta\, d\varphi$$

-continued $$Y^{\pm}_{l,m,h,k} = \varepsilon_k \frac{2h+1}{4\pi} \frac{(h-k)!}{(h+k)!}$$
$$\int_0^{2\pi} \int_0^{\pi} [R(\vartheta,\varphi)]^l P_l^m(\cos\vartheta) P_h^k(\cos\vartheta) \sin m\varphi \begin{pmatrix} \cos k\varphi \\ \sin k\varphi \end{pmatrix} \sin\vartheta\, d\vartheta\, d\varphi \quad 5$$

and wherein:

$\nabla^2$ is a Laplace operator,
U is an intermediate function,
r is a radius,
h, k, l, m are integers,
$N_0$ is an ellipsoid harmonic at a convenient point, and
$P_l^m$ is a Legendre polynomial of the first kind.

8. The shimming method as claimed in claim 6, wherein the coefficients are corrected using a perturbation-iteration algorithm comprising the steps of:
    calculating the additional coefficients by expansion, from the measured field sampling values;
    calculating the coefficients of the polynomial from the additional coefficients;
    calculating a maximum difference between the field represented by the polynomial and the measured field;
    comparing the calculated maximum difference with a predetermined threshold value;
    if the maximum calculated difference exceeds the predetermined threshold value, calculating new additional coefficients based on the expansion calculated on the difference between the field represented by the polynomial and the measured field;
    updating the additional coefficients with the new additional coefficients;
    iterating the method until a calculated maximum difference value is obtained that is smaller than the threshold value; and
    using the coefficients so obtained to calculate the position and magnitude parameters of the correction elements.

9. The shimming method as claimed in claim 8, wherein a maximum degree of truncation of the polynomial is established, and approval of such maximum degree for the shimming method is confirmed by convergence of the perturbation-iteration algorithm.

* * * * *